(12) United States Patent
You et al.

(10) Patent No.: US 7,415,679 B2
(45) Date of Patent: Aug. 19, 2008

(54) SYSTEM AND METHOD FOR SELECTING MOSFETS SUITABLE FOR A CIRCUIT DESIGN

(75) Inventors: Yong-Xing You, Guangdong (CN); Xiang Cao, Guangdong (CN)

(73) Assignees: Hong Fu Precision Industry (Shen Zhen) Co., Ltd., Bao'an, Shenzhen, Guangdong Province (TW); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 159 days.

(21) Appl. No.: 11/308,458

(22) Filed: Mar. 28, 2006

(65) Prior Publication Data

US 2007/0055950 A1 Mar. 8, 2007

(30) Foreign Application Priority Data

Sep. 2, 2005 (CN) .................. 2005 1 0037019

(51) Int. Cl.
*G06F 17/50* (2006.01)
(52) U.S. Cl. .................. 716/1; 716/2; 716/4
(58) Field of Classification Search .......... 716/1, 716/2, 4
See application file for complete search history.

(56) References Cited

U.S. PATENT DOCUMENTS

| | | | | |
|---|---|---|---|---|
| 5,734,798 A * | 3/1998 | Allred | ............ | 706/47 |
| 5,852,737 A * | 12/1998 | Bikowsky | ............ | 713/323 |
| 5,901,066 A * | 5/1999 | Hong | ............ | 716/8 |
| 5,987,086 A * | 11/1999 | Raman et al. | ............ | 716/1 |
| 5,995,734 A * | 11/1999 | Saika | ............ | 716/9 |
| 6,167,556 A * | 12/2000 | Sun et al. | ............ | 716/3 |
| 6,496,965 B1 * | 12/2002 | van Ginneken et al. | ............ | 716/10 |
| 6,808,965 B1 * | 10/2004 | Miyasaka et al. | ............ | 438/151 |
| 6,873,048 B2 | 3/2005 | Gao et al. | | |
| 7,055,121 B1 * | 5/2006 | Bolander et al. | ............ | 716/11 |
| 7,093,217 B1 * | 8/2006 | Signore et al. | ............ | 716/5 |
| 2003/0101422 A1 * | 5/2003 | Keller et al. | ............ | 716/4 |
| 2003/0131318 A1 * | 7/2003 | Mandal et al. | ............ | 715/517 |
| 2004/0139186 A1 * | 7/2004 | Lee et al. | ............ | 709/223 |
| 2005/0240463 A1 * | 10/2005 | Chen et al. | ............ | 705/10 |
| 2005/0288899 A1 * | 12/2005 | Winstead et al. | ............ | 702/183 |

\* cited by examiner

*Primary Examiner*—Paul Dinh
*Assistant Examiner*—Suchin Parihar
(74) *Attorney, Agent, or Firm*—Winston Hsu

(57) ABSTRACT

The present invention provides a computer-based method for selecting MOSFETs suitable for a circuit design. The method includes the steps of: providing a database (18) that stores specifications and product information of various MOSFETs; receiving specifications of a circuit design; analyzing the circuit design specifications and determining whether the circuit design specifications satisfy the predetermined requirements for a normal circuit design; computing specifications of proper MOSFETs for the circuit design according to the specifications, and determining if the circuit design specifications satisfy the predetermined requirements; and searching the database for the proper MOSFETs according to the specifications of the proper MOSFETs. A related system is also provided.

12 Claims, 3 Drawing Sheets

SYSTEM AND METHOD FOR SELECTING MOSFETS SUITABLE FOR A CIRCUIT DESIGN

DESCRIPTION

1. Field of the Invention

The present invention is generally related to a system and method for selecting an electricity unit for a circuit design.

2. Description of Related Art

A linear voltage regulator (LVR) is widely used in circuit designing, almost covering all electronic products, such as motherboards of personal computers (PCs), servers, personal digital assistants (PDAs), and various other commercialized electronic products. A metallic oxide semiconductor field effect transistor (MOSFET) is an essential and important unit of an LVR within the full circuit design. Therefore, it is very important to choose proper MOSFETs compatible for a circuit design.

Before choosing proper MOSFETs for a circuit design, a circuit designer needs to pay special attention when considering the specifications of a MOSFET that primarily includes a consumed power, a grid-source voltage, a highest drain-source on-resistance, and an inner surface temperature of the MOSFET. However, to determine the specification of a MOSFET for a circuit is a hard and time-consuming work, it is conventionally done by circuit designers whom may cause wrongly computed specification of the MOSFET. In addition, there is a huge amount of MOSFETs products in the market, making it hard to select the proper MOSFETs from the large amount of available MOSFETs according to the computed specification even though the computed specification is correct.

What is needed, therefore, is a solution that can assist a circuit designer to not only correctly and quickly determine the specification of proper MOSFETs for a circuit design, but also, to quickly find the proper MOSFETs from a large amount of available MOSFETs products in the market according to the correctly computed specification.

SUMMARY OF INVENTION

One embodiment of a system for selecting MOSFETs suitable for a circuit design is provided. The system includes a database and a computing device. The computing device is used for selecting the proper MOSFETs from the database, and includes a design specification receiving module, a design specification analyzing module, a MOSFET specification computing module, and a searching module. The database is used for storing specifications and product information of various available MOSFETs in the market. The design specification receiving module is used for receiving specifications of a circuit design. The design specification analyzing module is used for analyzing the circuit design specifications and determining whether the circuit design specifications satisfy the predetermined requirements for a normal circuit design. The MOSFET specification computing module is used for computing specifications of proper MOSFETs according to the circuit design specifications. The searching module is used for searching the database for the proper MOSFETs according to specifications.

One embodiment of a computer-based method for selecting MOSFETs compatible for a circuit design is also provided. The method includes the steps of: providing a database that stores specifications and product information of various MOSFETs, a computing device for selecting the proper MOSFETs from the database; receiving specifications of a circuit design by the computing device; analyzing the circuit design specifications for determining whether the circuit design specifications satisfy the predetermined requirements for a normal circuit design; computing specifications of proper MOSFETs for the circuit design according to the specifications of the circuit design and determining if the circuit design specifications satisfy the predetermined requirements; and searching the database for the proper MOSFETs according to the specifications.

Other systems, methods, features, and advantages of the present invention will be or become apparent to one with skill in the art upon examination of the following drawings and detailed description.

DETAILED DESCRIPTION

Figure 1:
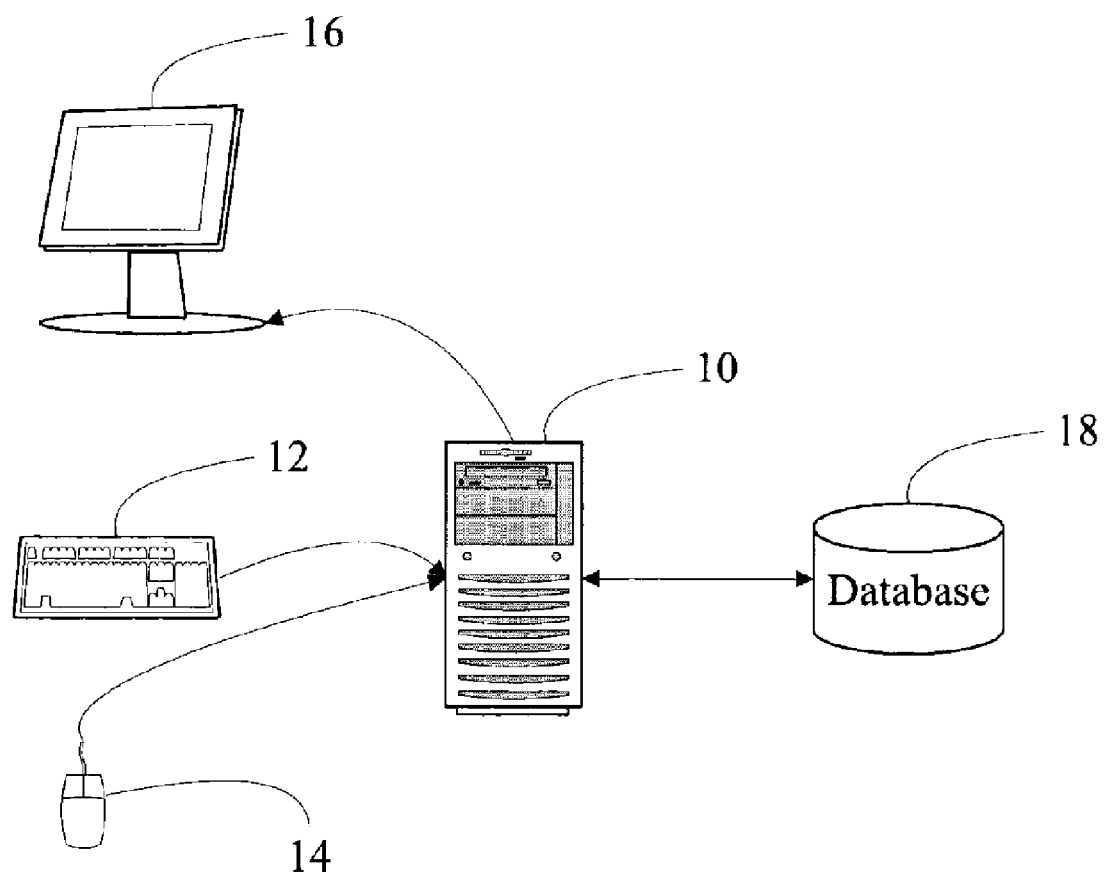
FIG. 1 is a schematic diagram illustrating hardware configuration of a system for selecting MOSFETs compatible for a circuit design, in accordance with one preferred embodiment.

FIG. 1 is a schematic diagram illustrating hardware configuration of a system for selecting MOSFETs suitable for a circuit design, in accordance with one preferred embodiment. The hardware configuration of the system typically includes a computer 10, input devices such as a keyboard 12 and a mouse 14, a display unit such as a liquid crystal display monitor 16 (LCD monitor 16), and a database 18. The keyboard 12, the mouse 14, the LCD monitor 16 and the database 18 are associated with the computer 10.

The database 18 is used for storing specifications and product information of various MOSFETs currently commercially available in the market. Product information of each MOSFET typically includes a product type, a manufacturer, and a unit price. The keyboard 12 and the mouse 14 are used for inputting the specifications and product information of the various MOSFETs, which can be received by the computer 10 and stored into the database 18. The keyboard 12 and the mouse 14 are further used for inputting specifications of a circuit design. Also, the keyboard 12 and the mouse 14 are used for data input and operation assistance of the computer 10.

The computer 10 can be an IBM personal computer, a Macintosh, or any other computing device that can process and compute data, such as a server, a personal digital assistant (PDA), or a cell phone. The computer 10 is installed with particular software for selecting the proper MOSFETs for a circuit design from the database 18. Specifically, the software receives specifications of the circuit design, computes specifications of the proper MOSFETs according to the received specifications, and searches for matching MOSFETs in the database 18 accordingly.

The LCD monitor 16 is used for providing a graphical user interface (GUI) to assist users and/or circuit designers to operate the computer 10, such as inputting specifications of a circuit design. The LCD monitor 16 is additionally used for displaying the specifications and product information of the proper MOSFETs selected from the database 18 by the software.

Figure 2:
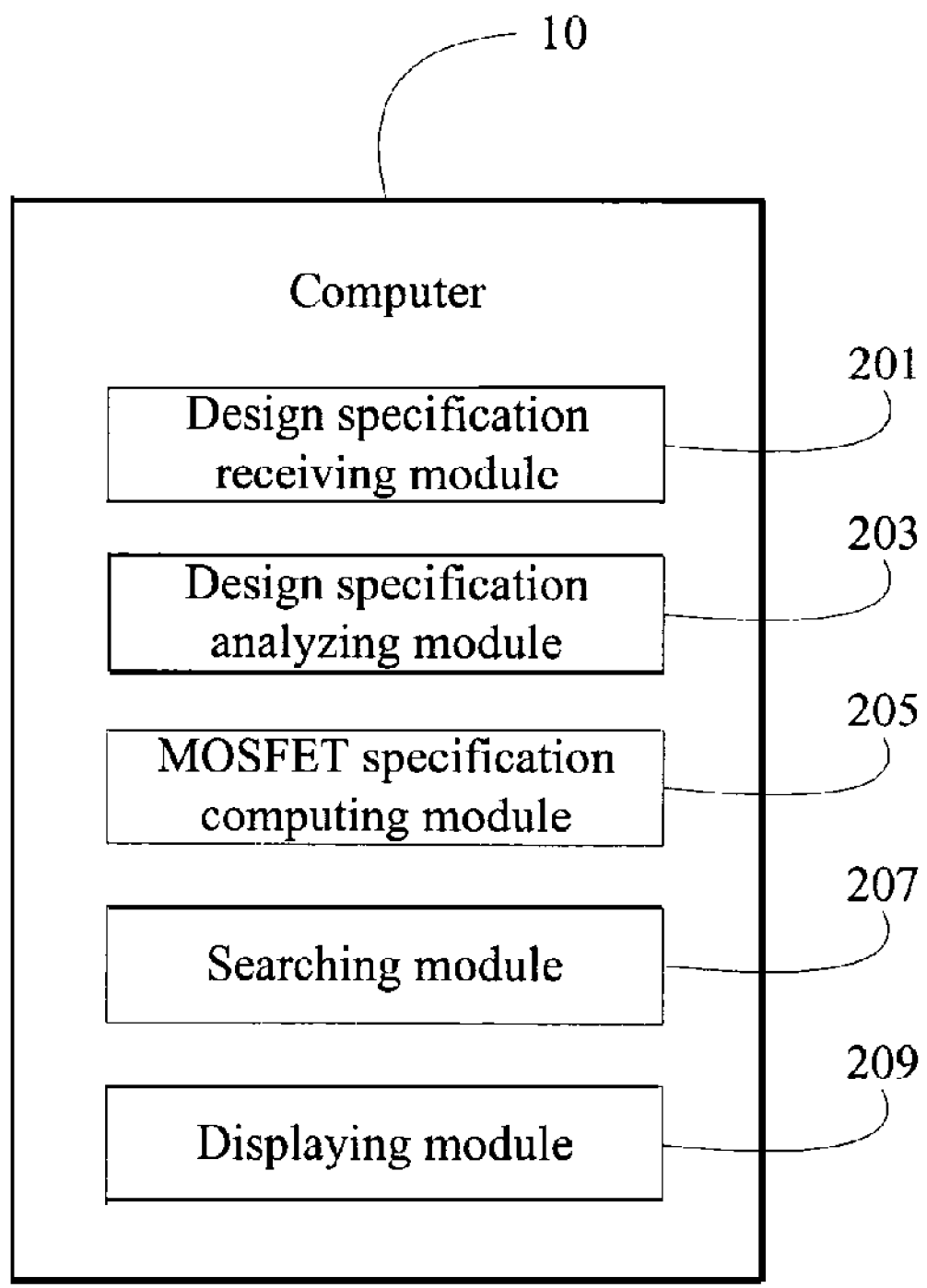
FIG. 2 is a schematic diagram illustrating function modules of a computer of FIG. 1.

FIG. 2 is a schematic diagram illustrating function modules of the computer 10 of FIG. 1. The computer 10 includes a design specification receiving module 201, a design specification analyzing module 203, a MOSFET specification computing module 205, a searching module 207, and a displaying module 209.

The design specification receiving module 201 is used for receiving specifications of a circuit design. The specifications generally include an input voltage (hereinafter, "Vin"), an output voltage (hereinafter, "Vout"), an output current (hereinafter, "Iout"), and an upper limit of an outer surface temperature of a MOSFET (hereinafter, "Ti"). These specifications can be inputted by a designer (through the use of/using) the keyboard 12 and the mouse 14.

The design specification analyzing module 203 is used for analyzing the circuit design specifications and determining whether the circuit design specifications satisfy predetermined requirements for a normal circuit design. It is presumed that a designer has ordinary skill in the art and would make basic consideration for circuit design specifications when making any circuit design. Therefore, the design specification analyzing module 203 only checks the predetermined requirements for a circuit design where most designers tend to make mistakes. The predetermined requirements may include: a Vin that must be higher than Vout; a Ti that must be higher than the lowest temperature specified by the art (currently this threshold is 55 degrees centigrade according to the year 2005). It should be noted that the lowest temperature specified by the art could be modified if it is updated in the art.

The MOSFET specification computing module 205 is used for computing specifications of proper MOSFETs according to the specifications of the circuit design. The specifications of each MOSFET includes: a consumed power (hereinafter, "Pdis"), a minimum grid-source voltage (hereinafter, "Vgs"), a highest drain-source on-resistance (hereinafter, "Rds(on) max"), and an inner surface temperature of a MOSFET (hereinafter, "Tc").

Specifically, Pdis is computed by the formula: Pdis=(Vin−Vout)*Iout; Rds(on)max is computed by the formula: Rds(on)max=(Vin−Vout)/Iout; and Tc is computed by the formula: Tc=Ti+(Rthjc*Pdis). It should be noted that Rthjc is a constant and can be found in a specification reference in the art.

Vgs is determined according to Transfer Characteristics of an MOSFET associated with Iout by a first formula.

$$f(Vgs) = \frac{\mu_n C_{ox} W}{2L}(Vgs - Vgs_{(th)})^2,$$

and a second formula $$Id = \frac{\mu_n C_{ox} W}{2L}(Vgs - Vgs_{(th)})$$

In particular, the first formula is the Transfer Characteristics of MOSFET, in which Id is a drain current and is known equal to the output current Iout. The second formula is a function expression of grid-source voltage, where Vgs is the minimum grid-source voltage as set forth above, W/L is the ratio of width over length of a channel of a MOSFET, $\mu_n$ is for free electron Drift mobility, Cox is for grid capacitance of unit area, and Vgs(th) is for threshold voltage of a MOSFET. It should be noted that, in the particular art, W/l, $\mu_n$, Cox and Vgs(th) are determined constants. For example, suppose that $$\frac{\mu_n C_{ox} W}{2L}$$

is determined to be a constant of 0.17A/V², Vgs(th)=2V, and Id=Iout=10A, Vgs is determined to be about 3.3V accordingly.

The searching module 207 is used for searching the database 18 for the proper MOSFETs according to the specifications of the proper MOSFETs. Specifically, the searching module computes the margins of the Pdis, Vgs, Rds(on)max, and Tc according to the specifications and queries the database for any MOSFETs with the desired attributes. In further detail, the searching module 207 computes margins of the Pdis computed by the MOSFET specification computing module 205 and Pdis of each of the MOSFETs according to the specifications of various MOSFETs stored in the database 18, computes margins of the Vgs computed by the MOSFET specification computing module 205 and Vgs of each of the MOSFETs according to the specifications of various MOSFETs stored in the database 18, computes margins of the Rds(on)max computed by the MOSFET specification computing module 205 and Rds(on)max of each of the MOSFETs according to the specifications of various MOSFETs stored in the database 18, and computes margins of the Tc computed by the MOSFET specification computing module 205 and Tc of each of the MOSFETs according to the specifications of various MOSFETs stored in the database 18, and selects proper MOSFETs which have minimum of each of the above margins.

The displaying module 209 is used for displaying the specifications and product information of the proper MOSFETs. Specifically, the displaying module 209 is used for conducting the LCD monitor 16 to provide a graphic user interface (GUI) for users or circuit designers to operate the computer 10, such as inputting specifications of a circuit design, it also displays the specifications and product information of the proper MOSFETs selected from the database 18 by the searching module 207. The product information of a MOSFET typically includes a product type, a manufacturer, and a unit price. A designer may further filter the MOSFETs by considering the product information, such as the unit price.

Figure 3:
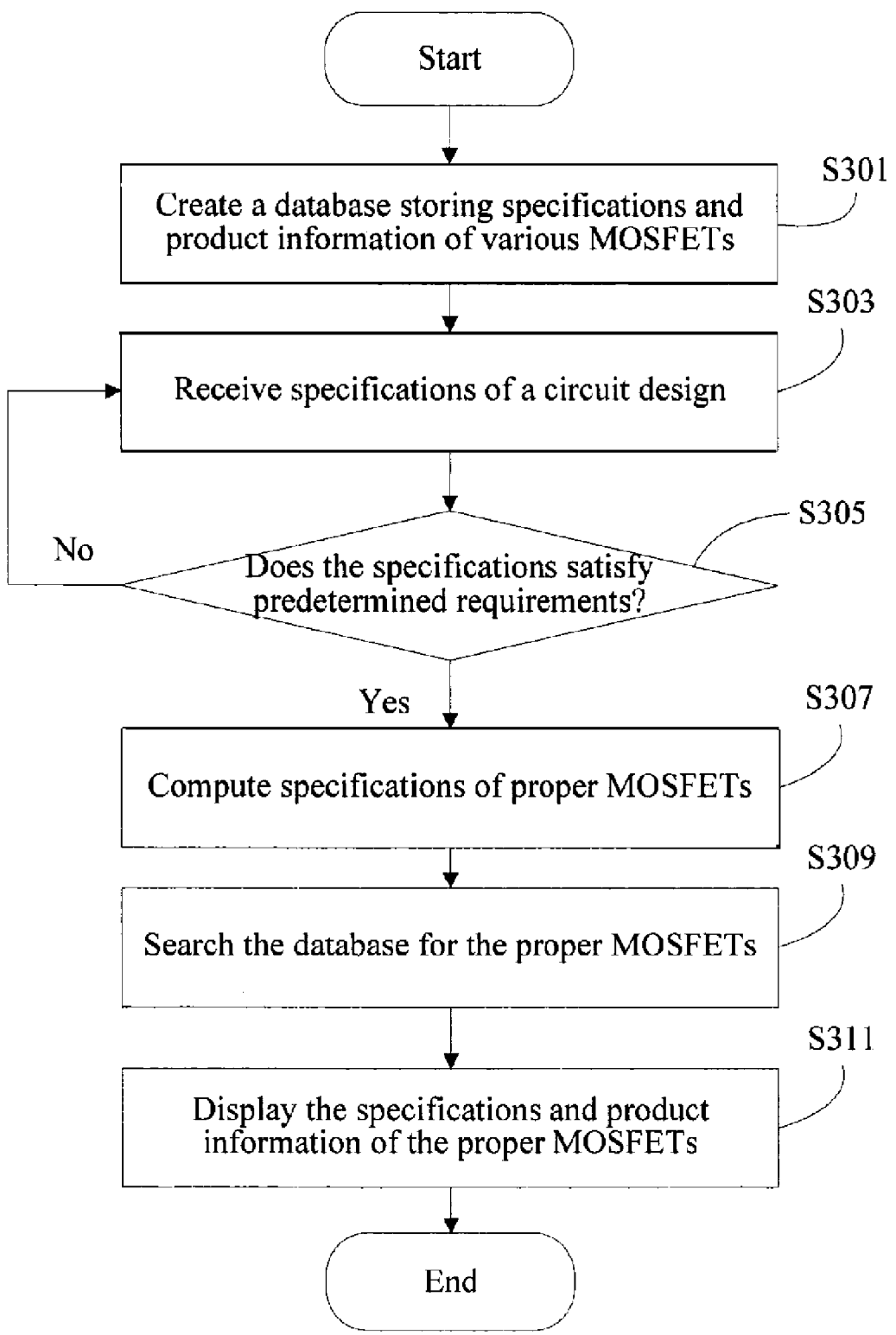
FIG. 3 is a flowchart of a preferred method for selecting MOSFETs compatible for a circuit design.

FIG. 3 is a flowchart of a preferred method for selecting MOSFETs compatible for a circuit design. In step S301, a designer creates a database 18 by using the computer 10, the keyboard 12, the mouse 14, and the LCD monitor 16. The database 18 stores specifications and product information of various MOSFETs currently commercially accessible in the market. Each MOSFET corresponds to a record in the database 18, and is specified with a plurality of field entries of a record in the database 18. In step S303, the design specification receiving module 201 receives specifications of a circuit design that may be inputted by a user through using the computer 10 and inputting devices associated thereto. For example, Vin=2.8V, Vout=2.5V, Iout=10A and Ti=70 centigrade. The example forms the basis of executing upcoming steps from S303 to S311.

In step S305, the design specification analyzing module 203 analyzes the specifications of the circuit design and determines whether the circuit design specifications satisfy predetermined requirements for a normal circuit design as set forth above in relation to introduction of the design specification analyzing module 203.

If the circuit design specifications satisfy the predetermined requirements for a normal circuit design, the procedure goes directly to step S307. Otherwise, if the circuit design specifications do not satisfy the predetermined requirements, the procedure returns step S303 as described above.

Continuing the example set forth above in describing step S303, the circuit design specifications do satisfy the predetermined requirements for a normal circuit design. In step S307, the MOSFET specification computing module 205 computes specifications of proper MOSFETs for the circuit design according to the specifications of the circuit design received by the design specification receiving module 201. According to the example, if it is determined in step S307 that Pdis=(Vin−Vout)*Iout=(2.8V−2.5V)*10A=3W, and Rds(on) max=(Vin−Vout)/Iout=(2.8V−2.5V)/10A=0.03Ω=30mΩ. According to the specification reference in the art, Rthjc=3.2, thus, Tc=Ti+(Rthjc*Pdis)=70+(3.2*3)=79.6 centigrade. Further, according to Transfer Characteristics of MOSFET associated with Iout, it can be determined that Vgs=3.3V.

In step S309, the searching module 207 is used for searching the database 18 for the proper MOSFETs according to the specifications of the proper MOSFETs. The searching module 207 selects records of proper MOSFETs from the database 18, referring back to introduction of the searching module 207 set forth above for details. In step S311, the displaying module 209 conducts the LCD monitor 16 to display the specifications and product information of the proper MOSFETs. A designer may further filter the MOSFETs by considering the product information, such as unit price.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A system for selecting MOSFETs suitable for a circuit design, the system comprising:
a database for storing predetermined specifications and product information of various MOSFETs; and
a computing device for selecting proper MOSFETs for the circuit design from the database, the computing device comprising:
a design specification receiving module for receiving specifications of the circuit design;
a design specification analyzing module for analyzing the circuit design specifications and determining whether the circuit design specifications satisfy predetermined requirements of the circuit design;
a MOSFET specification computing module for computing specifications of proper MOSFETs for the circuit design according to the specifications of the circuit design; and
a searching module for computing margins of the predetermined specifications and the computed specifications, selecting a minimum margin from the margins, and searching the database for the proper MOSFETs according to the minimum margin.

2. The system according to claim 1, wherein the specifications of the circuit design comprise: an input voltage, an output voltage, an output current and an upper limit of outer surface temperature of a MOSFET.

3. The system according to claim 1, wherein the computing device further comprises a displaying module for displaying the specifications and product information of the proper MOSFETs.

4. The system according to claim 1, wherein the product information of each MOSFET comprises: a product type, a manufacturer, and a unit price of the MOSFET.

5. The system according to claim 1, wherein the specifications of each of the proper MOSFETs comprise: a consumed power, a minimum grid-source voltage, a highest drain-source on-resistance, and an inner surface temperature.

6. The system according to claim 5, wherein the searching module is further used for:
computing margins of the computed consumed power and the consumed power of each of the MOSFETs stored in the database;
computing margins of the computed minimum grid-source voltage and the minimum grid-source voltage of each of the MOSFETs stored in the database;
computing margins of the computed highest drain-source on-resistance and the highest drain-source on-resistance of each of the MOSFETs stored in the database;
computing margins of the computed inner surface temperature and the inner surface temperature of each of the MOSFETs stored in the database; and
querying the database for any MOSFETs having the minimum margin of each of the above kinds of computed margins.

7. A computer-based method for selecting MOSFETs suitable for a circuit design, the method comprising the steps of:
providing a database that stores predetermined specifications and product information of various MOSFETs, and a computing device for selecting proper MOSFETs for the circuit design from the database;
receiving specifications of a circuit design by the computing device;
analyzing the circuit design specifications and determining whether the circuit design specifications satisfy predetermined requirements of the circuit design;
computing specifications of proper MOSFETs for the circuit design according to the specifications of the circuit design, if the circuit design specifications satisfy predetermined requirements of the circuit design;
computing margins of the predetermined specifications and the computed specifications, and selecting a minimum margin from the margins; and
searching the database for the proper MOSFETs having the minimum margin.

8. The method according to claim 7, wherein the specifications of the circuit design comprise: an input voltage, an output voltage, an output current, and an upper limit of outer surface temperature of a MOSFET.

9. The method according to claim 7, further comprising the step of:
displaying the specifications and product information of the proper MOSFETs.

10. The method according to claim 7, wherein the product information of each MOSFET comprises: a product type, a manufacturer, and a unit price of the MOSFET.

11. The method according to claim 7, wherein the specifications of each of the proper MOSFETs comprise: a consumed power, a minimum grid-source voltage, a highest drain-source on-resistance, and an inner surface temperature.

12. The method according to claim 11, wherein the step of computing margins comprises steps of:

computing margins of the computed consumed power and the consumed power of each of the MOSFETs stored in the database;

computing margins of the computed minimum grid-source voltage and the minimum grid-source voltage of each of the MOSFETs stored in the database;

computing margins of the computed highest drain-source on-resistance and the highest drain-source on-resistance of each of the MOSFETs stored in the database; and computing margins of the computed inner surface temperature and the inner surface temperature of each of the MOSFETs stored in the database.

* * * * *